United States Patent
Saito et al.

(10) Patent No.: US 8,482,028 B2
(45) Date of Patent: Jul. 9, 2013

(54) SEMICONDUCTOR DEVICE

(75) Inventors: Wataru Saito, Hyogo-ken (JP); Syotaro Ono, Hyogo-ken (JP); Toshiyuki Naka, Kanagawa-ken (JP); Shunji Taniuchi, Ishikawa-ken (JP); Miho Watanabe, Miyagi-ken (JP); Hiroaki Yamashita, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/424,340

(22) Filed: Mar. 19, 2012

(65) Prior Publication Data
US 2012/0241847 A1   Sep. 27, 2012

(30) Foreign Application Priority Data

Mar. 23, 2011 (JP) .................................. 2011-064668

(51) Int. Cl.
*H01L 29/772* (2006.01)
*H01L 21/335* (2006.01)

(52) U.S. Cl.
USPC .................. 257/135; 257/329; 257/E29.262; 257/E21.41; 438/193; 438/268

(58) Field of Classification Search
USPC ..... 257/135, 329, E29.262, E21.41; 438/193, 438/137, 268
See application file for complete search history.

(56) References Cited

U.S. PATENT DOCUMENTS

| 7,737,469 | B2 | 6/2010 | Saito et al. |
| 7,759,732 | B2 | 7/2010 | Saito et al. |
| 7,812,392 | B2 * | 10/2010 | Saito et al. ..................... 257/329 |
| 8,013,360 | B2 | 9/2011 | Saito et al. |
| 8,026,558 | B2 * | 9/2011 | Grebs et al. ..................... 257/401 |
| 2008/0135931 | A1 * | 6/2008 | Challa et al. .................. 257/331 |
| 2008/0246085 | A1 * | 10/2008 | Saito et al. .................... 257/342 |
| 2009/0032851 | A1 * | 2/2009 | Pfirsch et al. ................. 257/288 |
| 2010/0140689 | A1 * | 6/2010 | Yedinak et al. ............... 257/330 |
| 2010/0207205 | A1 * | 8/2010 | Grebs et al. ................... 257/334 |
| 2010/0230750 | A1 * | 9/2010 | Saito et al. .................... 257/341 |
| 2011/0220992 | A1 * | 9/2011 | Inomata ........................ 257/330 |

FOREIGN PATENT DOCUMENTS

| JP | 2000-040822 | 2/2000 |
| JP | 2000-277726 | 10/2000 |
| JP | 2002-524879 | 8/2002 |

* cited by examiner

*Primary Examiner* — Steven J Fulk
(74) *Attorney, Agent, or Firm* — Patterson & Sheridan, LLP

(57) ABSTRACT

According to one embodiment, a semiconductor device includes a first semiconductor layer of a first conductive type, and a periodic array structure having a second semiconductor layer of a first conductive type and a third semiconductor layer of a second conductive type periodically arrayed on the first semiconductor layer in a direction parallel with a major surface of the first semiconductor layer. The second semiconductor layer and the third semiconductor layer are disposed in dots on the first semiconductor layer. A periodic structure in the outermost peripheral portion of the periodic array structure is different from a periodic structure of the periodic array structure in a portion other than the outermost peripheral portion.

17 Claims, 9 Drawing Sheets

SEMICONDUCTOR DEVICE

CROSS-REFERENCE TO RELATED APPLICATIONS

This application is based upon and claims the benefit of priority from Japanese Patent Application No. 2011-064668, filed on Mar. 23, 2011; the entire contents of which are incorporated herein by reference.

FIELD

Embodiments are generally related to a semiconductor device.

BACKGROUND

The power MOSFET (Metal Oxide Semiconductor Field Effect Transistor) is a semiconductor device having electrodes on a top face and a bottom face, in which electric current flows vertically. As is common in this type device, ON resistance of the power MOSFET strongly depends on electrical resistance of a drift layer, which is a conductive layer. An impurity concentration in the drift region, which determines the electrical resistance, cannot be increased beyond the limit, depending on the breakdown voltage of a pn junction between a base region and the drift layer. Thus, there is a tradeoff relationship between the breakdown voltage and the ON resistance, and there is a limit, induced by the device material, for optimizing both of the breakdown voltage and the ON resistance. Hence, it is important for making low power consumption devices to overcome this limit, and it is a way to implement a low ON resistance device beyond existing power MOSFETs.

In recent years, the MOSFET with a super junction (SJ) structure has attracted attention as the device that solves this problem, in which a p-type pillar layer and an n-type pillar layer are buried in a drift layer. Since the SJ structure includes almost the same amount of p type impurities in the p-type pillar layer with an n-type impurity in the n-type pillar layer, the drift layer becomes a pseudo non-doped layer with a balance of the negative charges in the p-type pillar and the positive charges in the n-type pillar, when being depleted. Then, it is possible to form a highly doped n-type pillar layer with low resistance, through which the current flows, while maintaining a high breakdown voltage owing to the charge balance between the n-type pillar and the p-type pillar. Thereby, a low ON resistance is implemented, which exceeds the limit of a material.

In addition, it is necessary for the power MOSFET to hold a high breakdown voltage also in a termination region provided around an active region. There is a structure that prevents a breakdown due to a variation in the amount of impurity in the termination region without forming the SJ structure.

In this structure, a low-concentration drift layer is provided in the termination region instead of the SJ structure. Further, a concentration of the impurity contained in the pillar layer in the outermost peripheral portion of the SJ structure is almost a half of the impurity concentration in the pillar layers in the portion other than the outermost peripheral portion. Hence, the power MOSFETs having such a structure are expected to have a higher breakdown voltage.

BRIEF DESCRIPTION OF THE DRAWINGS

FIG. 1A is a schematic plane view illustrating the outline of an overall semiconductor device; and FIG. 1B is a schematic cross sectional view at a position along a line α-β in FIG. 1A;

DETAILED DESCRIPTION

According to one embodiment, a semiconductor device includes a first semiconductor layer of a first conductive type, and a periodic array structure having a second semiconductor layer of a first conductive type and a third semiconductor layer of a second conductive type periodically arrayed on the first semiconductor layer in a direction parallel with a major surface of the first semiconductor layer. The device includes a fourth semiconductor layer of a second conductive type provided on the third semiconductor layer, a fifth semiconductor layer of a first conductive type selectively provided on a surface of the fourth semiconductor layer, and a control electrode facing a part of the second semiconductor layer, the fourth semiconductor layer, and a part of the fifth semiconductor layer via an insulating film. The device also includes a sixth semiconductor layer of a first conductive type provided on the first semiconductor layer on an outer side of the periodic array structure, a concentration of an impurity contained in the sixth semiconductor layer being lower than a concentration of an impurity contained in the periodic array structure, a first major electrode electrically connected to the first semiconductor layer, and a second major electrode connected to the fourth semiconductor layer and the fifth semiconductor layer. The second semiconductor layer and the third semiconductor layer are disposed in dots on the first semiconductor layer. A periodic structure in the outermost peripheral portion of the periodic array structure is different from a periodic structure of the periodic array structure in a portion other than the outermost peripheral portion.

Hereinafter, embodiments of the invention will now be described with reference to the drawings.

First Embodiment

Figure 1A:
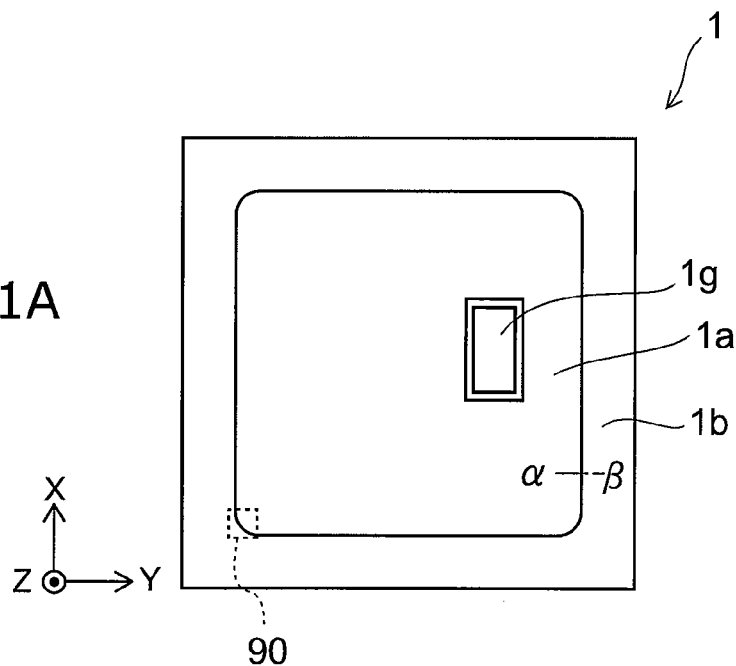
FIGS. 1A and 1B are schematic views illustrating a semiconductor device according to a first embodiment.
Figure 1B:
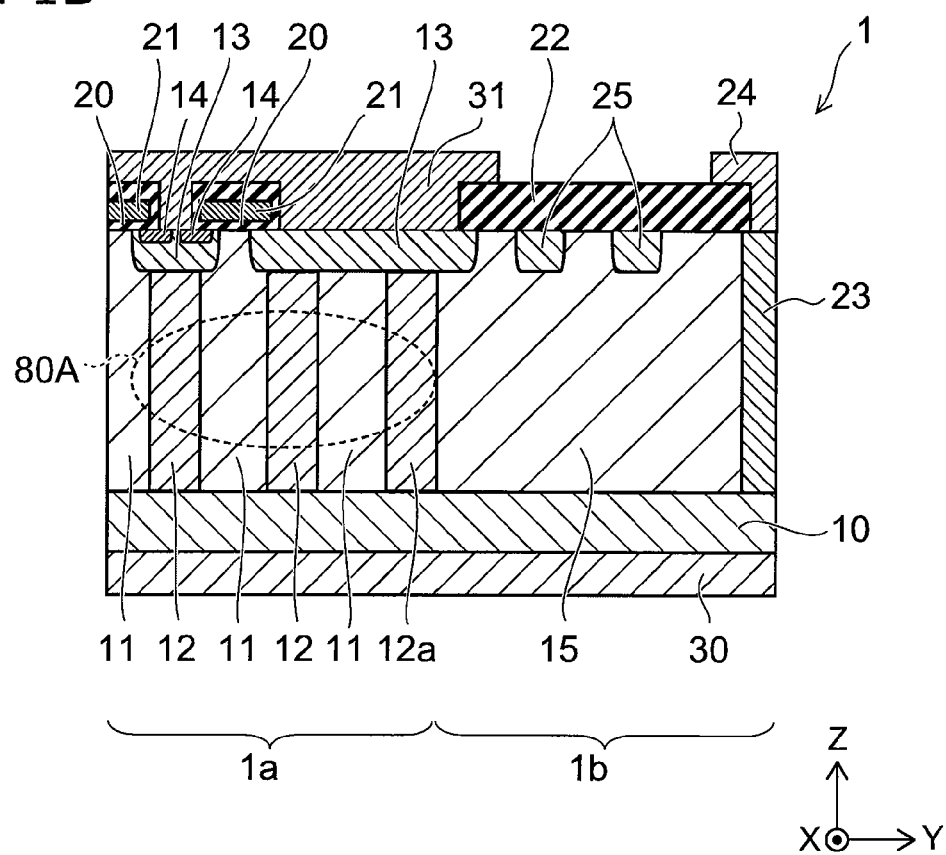

FIG. 1A and FIG. 1B are schematic views illustrating a semiconductor device according to a first embodiment. FIG. 1A is a schematic plane view illustrating the outline of an overall semiconductor device, and FIG. 1B is a schematic cross sectional view at a position along a line α-β in FIG. 1A.

As shown in FIG. 1A, a semiconductor device 1 has an active region (a cell region) 1a and a termination region 1b provided around the active region 1a. A gate interconnection 1g is provided in the active region 1a.

As shown in FIG. 1B, the semiconductor device 1 includes a super junction structure (a periodic array structure) 80A on an n⁺ drain layer (a first semiconductor layer) 10, in which an n-type pillar layer (a second semiconductor layer) 11 and a p-type pillar layer (a third semiconductor layer) 12 are periodically arrayed in the direction parallel with the major surface of the drain layer 10.

In the semiconductor device 1, a p-type base layer (a fourth semiconductor layer) 13 is provided on the p-type pillar layer 12. An n⁺ source layer (a fifth semiconductor layer) 14 is selectively provided on the surface of the base layer 13. A gate electrode (a control electrode) 21 faces a part of the n-type pillar layer 11, the base layer (the fourth semiconductor layer) 13, and a part of the source layer 14 via a gate insulating film 20. The gate electrode 21 is electrically connected to the gate interconnection 1g described above.

In the semiconductor device 1, the SJ structure 80A is not provided in the termination region 1b. A p-type pillar layer 12a in the outermost peripheral portion of the SJ structure 80A is in contact with a high resistance layer (a sixth semiconductor layer) 15, which may have either n-type or p-type conductivity. Namely, the high resistance layer 15 is provided on the drain layer 10 outside the SJ structure 80A. An impurity concentration in the high resistance layer 15 is lower than that in the SJ structure 80A. For example, in order to obtain a high breakdown voltage in the semiconductor device 1, the impurity concentration in the high resistance layer 15 is preferably equal to or less than one-tenth of the impurity concentration in the n-type pillar layer 11 or the p-type pillar layer 12.

The n⁺ source layer 14 is not provided on the p-type base layer 13, which is provided on the p-type pillar layer 12a in the outermost peripheral portion of the SJ structure 80A.

A guard ring layer 25 is selectively provided on the surface of the high resistance layer 15, thereby suppressing the electric field concentration at the end portion of the base layer 13. Thus, the semiconductor device 1 holds a high termination breakdown voltage. A field insulating layer 22 is provided on the high resistance layer 15 and the guard ring layer 25.

A field stop layer 23 contacts with the side face of the high resistance layer 15 opposite to the SJ structure 80A. A field stop electrode 24 is provided on the field stop layer 23 and a part of the field insulating layer 22. A drain electrode (a first major electrode) 30 is electrically connected to the drain layer 10. A source electrode (a second major electrode) 31 is connected to the base layer 13 and the source layer 14.

The drain layer 10, the n-type pillar layer 11, the p-type pillar layers 12 and 12a, the base layer 13, the source layer 14, the high resistance layer 15, the field stop layer 23, and the guard ring layer 25 are silicon (Si) layers, for example. The gate electrode 21 and the gate interconnection 1g are made of polysilicon, for example. The material of the gate insulating film 20 and the field insulating layer 22 is silicon oxide ($SiO_2$), for example. The material of the drain electrode 30, the source electrode 31, and the field stop electrode 24 is a metal. In the embodiment, the n⁺ type and the n-type may be the first conductive type, and the p-type may be the second conductive type.

Suppose that a Z-axis direction (a first direction) shown in the drawing is a direction from the drain layer 10 toward the base layer 13, an X-axis direction (a second direction) is a direction vertical to the Z-axis direction, and a Y-axis direction (a third direction) is a direction vertical to the X-axis direction and the Z-axis direction. In the case where the planar configuration of the semiconductor device 1 is a rectangle, the X-axis direction extends along one side of the rectangle (a vertical side of the rectangle in FIG. 1A). Viewing the planar configuration of the SJ structure on the drain layer 10 that is supposed to have a rectangle shape, the periodic structure of the outermost peripheral portion in the direction parallel with one side of the rectangle (i.e. the X-axis direction) is different from the periodic structure of the outermost peripheral portion in the direction orthogonal thereto (i.e. the Y-axis direction).

Next, a method for forming the SJ structure 80A of the semiconductor device 1 will be described.

The SJ structure 80A is formed by repeating the process steps of ion implantation and crystal growth, for example. In this case, the impurity concentration in each of the n-type pillar layers 11 and the impurity concentration in each of the p-type pillar layer 12 can be adjusted by changing the area of the opening of a mask used in ion implantation. For example, the impurity concentration of the pillar layer in a specific portion may be selectively reduced by making the area of the mask opening smaller in the position corresponding to the specific portion.

The area of the opening of the mask is adjusted using photolithography or the like. For example, in order to reduce the impurity concentration of the pillar layer in the outermost peripheral portion to almost a half of that in the other pillar layers, it is sufficient that the area of the mask opening corresponding to the position of the pillar layer in the outermost peripheral portion is almost a half of the area of the opening of the mask corresponding to the positions of the other pillar layers. However, in the case where the resist mask is used, a variation in the area of the opening becomes greater as the area of the opening of the mask is smaller. Namely, when using the conventional technique, the pillar layer in the outermost peripheral portion tends to be formed with the greater variation in the impurity concentration.

Figure 2:
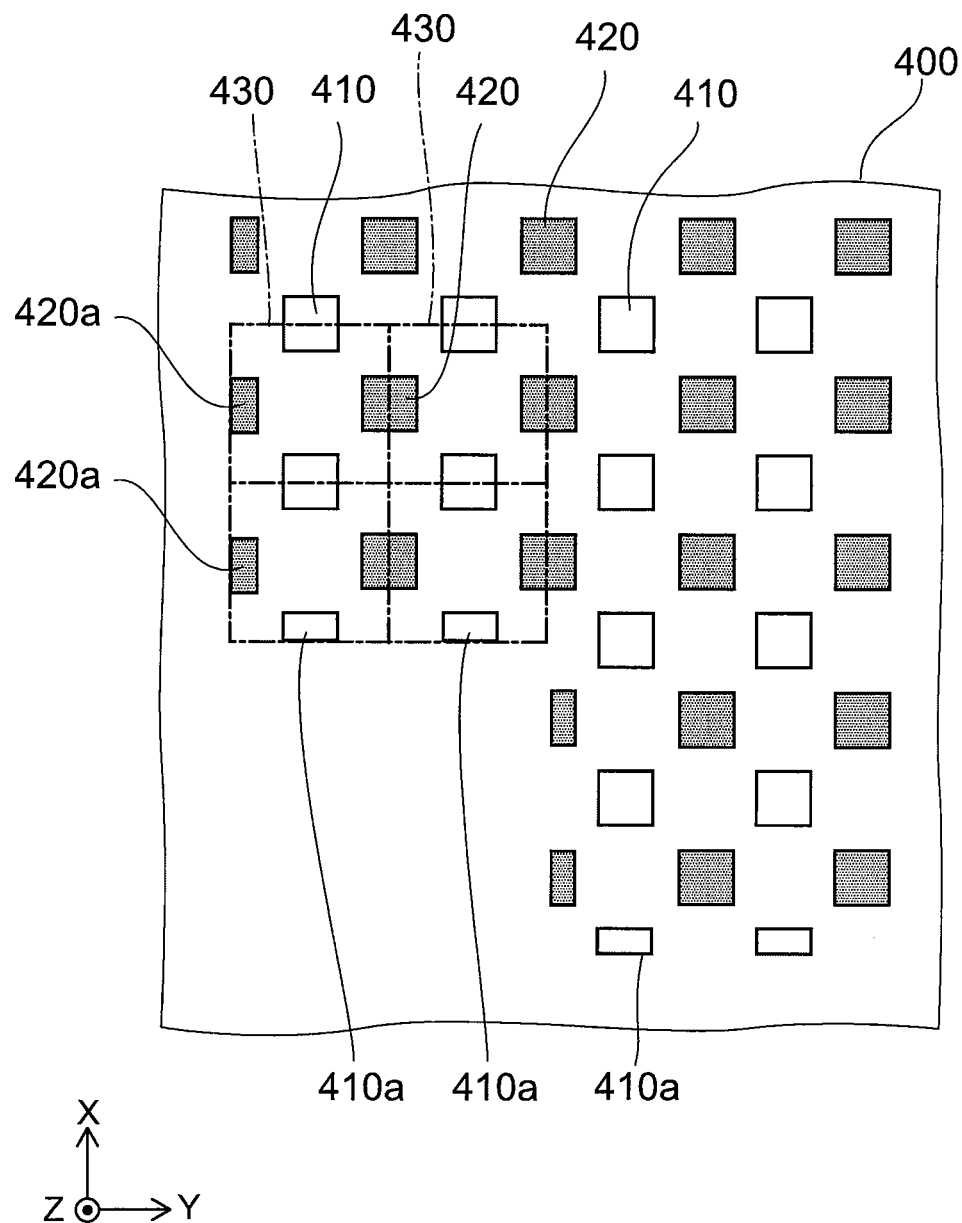
FIG. 2 is a schematic plane view illustrating a mask pattern for forming a super junction structure according to a reference sample.

For example, FIG. 2 is a schematic plane view illustrating a mask pattern for forming a super junction structure according to a reference sample. A mask pattern 400 illustrated in FIG. 2 is used in forming a region 90 shown in FIG. 1. In the ion implantation, an impurity is selectively implanted in a semiconductor layer through the openings of the mask pattern 400. It is noted that in FIG. 2, for convenience, openings 410 and 410a for implanting the n-type impurity and openings 420 and 420a for implanting the p-type impurity are shown together.

In the mask pattern 400, the opening 420 for forming a p-type pillar layer 12 and the opening 410 for forming an n-type pillar layer 11 are illustrated in a dot shape and periodically arranged. The position of the opening 410a and the position of the opening 420a correspond to the positions of the pillar layers of the SJ structure in the outermost peripheral portion. In the drawing, the region of a unit cell 430 in an active region 1a is shown.

In order to make the impurity concentration in a p-type pillar layer 12a in the outermost peripheral portion of the SJ structure almost a half of the impurity concentration in the p-type pillar layer 12 of the SJ structure in the portion other than the outermost peripheral portion, the area of the opening 420a is made to be almost a half of the area of the opening 420 as shown in FIG. 2. Thus, the amount of an impurity implanted through the opening 420a becomes almost a half of the amount of an impurity implanted through the opening 420.

Similarly, in order to make the impurity concentration in the n-type pillar layer in the outermost peripheral portion of the SJ structure almost a half of the impurity concentration in the n-type pillar layer 11 of the SJ structure in the portion other than the outermost peripheral portion, it is sufficient that the area of the opening 410a is made to be almost a half of the area of the opening 410 as shown in FIG. 2. Thus, the amount of an impurity implanted through the opening 410a becomes almost a half of the amount of an impurity implanted through the opening 410.

The areas of the openings 410a and 420a are made to be a half of the areas of the openings 410 and 420, so that the total amount of an impurity contained in the n-type pillar layer is almost equal to the total amount of an impurity contained in the p-type pillar layer in the unit cell 430.

With the use of the mask pattern 400, it is possible to make the impurity concentration in the p-type pillar layer (or the n-type pillar layer) in the outermost peripheral portion of the SJ structure almost a half of the impurity concentration in the p-type pillar layer (or the n-type pillar layer) of the SJ structure in the portion other than the outermost peripheral portion.

Figure 3:
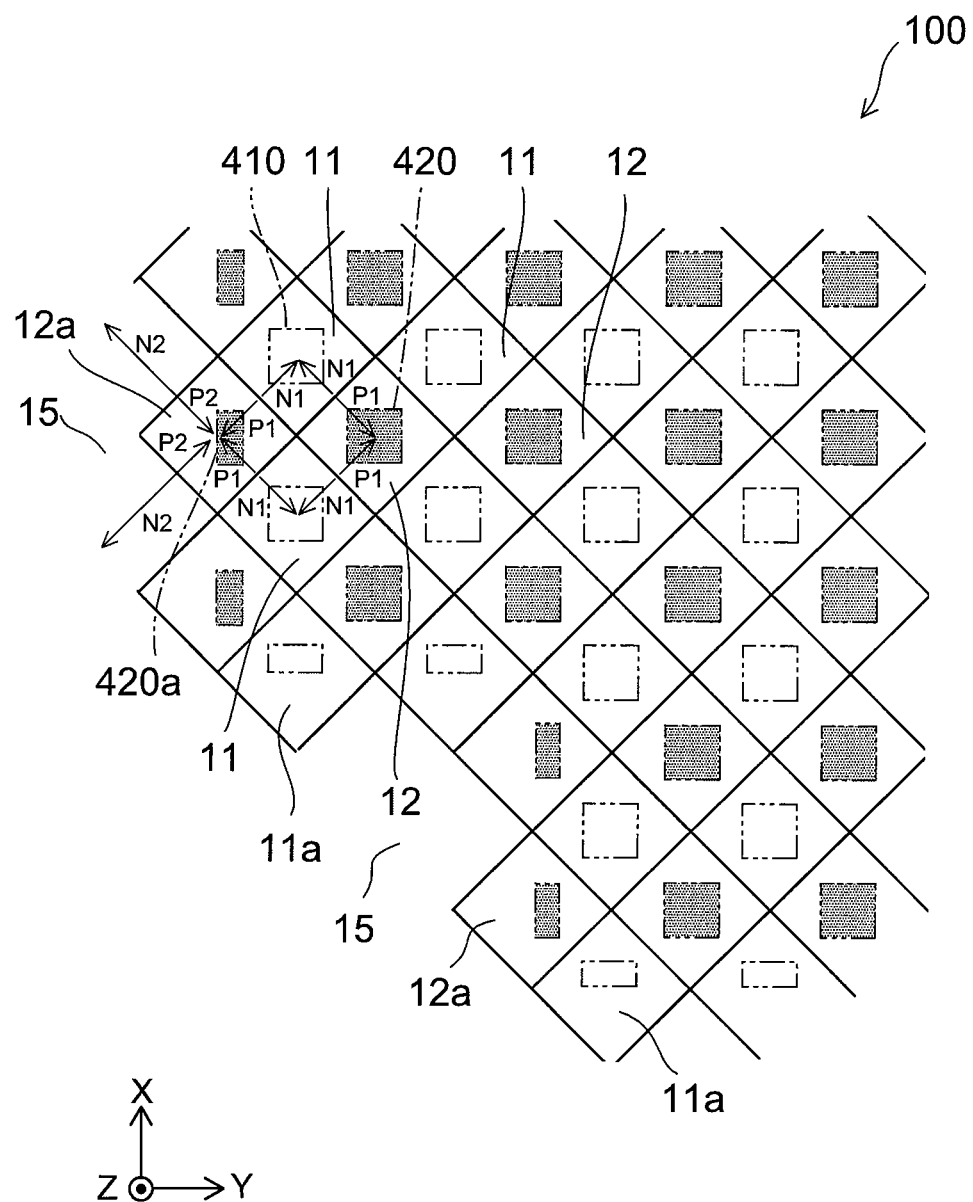
FIG. 3 is a schematic plane view illustrating a SJ structure according to the reference sample.

FIG. 3 shows a schematic view illustrating the planar configuration of the SJ structure when the SJ structure is formed using the mask pattern 400.

FIG. 3 is a schematic plane view illustrating the super junction structure according to the reference sample.

FIG. 3 shows the openings 410 and 420 and so on of the mask pattern 400 in addition to the n-type pillar layer 11, the p-type pillar layer 12, and so on, in order to understand the correspondence between the positions of the individual pillar layers and the positions of the openings of the mask pattern.

In an SJ structure 100 according to the reference sample, the p-type pillar layer 12a is formed at a location at which the opening 420a is provided. The p-type pillar layer 12a is located in the outermost peripheral portion of the SJ structure 100. The n-type pillar layer 11 is adjacent to the p-type pillar layer 12a on the SJ structure 100 side. A high resistance layer 15 is adjacent to the p-type pillar layer 12a on the side opposite to the SJ structure 100.

When the semiconductor device is in off-state, a potential difference is provided between the p-type pillar layers 12 and 12a and the n-type pillar layers 11 and 11a in such a way that the potentials of the n-type pillar layers 11 and 11a are higher than the potentials of the p-type pillar layers 12 and 12a, for example. Thus, a depletion layer extends toward the p-type pillar layers 12 and the n-type pillar layers 11 from a pn junction between the p-type pillar layer 12 and the n-type pillar layer 11, and each of the p-type pillar layers 12 and each of the n-type pillar layers 11 are completely depleted at a predetermined voltage.

For example, in the drawing, the direction of the depletion layer extending from the pn junction between the p-type pillar layer 12 and the n-type pillar layer 11 to the p-type pillar layer 12 side is expressed by an arrow P1, and the direction of the depletion layer extending from the pn junction to the n-type pillar layer 11 side is expressed by an arrow N1.

However, the pillar layer 12a located in the outermost peripheral portion of the SJ structure 100 is adjacent to the high resistance layer 15 at the impurity concentration lower than the impurity concentration of the p-type pillar layer 12a. Thus, the depletion layer does not tend to extend from a pn junction between the p-type pillar layer 12a and the high resistance layer 15 to the p-type pillar layer 12a side.

For example, in the drawing, the direction of the depletion layer extending from the pn junction between the p-type pillar layer 12a and the high resistance layer 15 to the p-type pillar layer 12a side is expressed by an arrow P2, and the direction of the depletion layer extending from the pn junction to the high resistance layer 15 side is expressed by an arrow N2.

As for the high resistance layer 15, since the impurity concentration of the high resistance layer 15 is low, the depletion layer easily extends from the pn junction. Thus, the length of the arrow N2, which expresses the extension of depletion, is depicted longer than the lengths of the arrows N1 and P1. However, it is likely that the depletion layer extending from the pn junction between the p-type pillar layer 12a and the high resistance layer 15 to the p-type pillar layer 12a side extends less than the depletion layer extending in the p-type pillar layer 12. A similar phenomenon possibly occurs in the n-type pillar layer 11a located in the outermost peripheral portion of the SJ structure 100.

In order to eliminate this phenomenon, in the reference sample, the areas of the openings 420a and 410a are formed smaller than the areas of the openings 420 and 410 for forming the p-type pillar layer 12a (or the n-type pillar layer 11a) at the impurity concentration lower than the impurity concentration of the p-type pillar layer 12 (or the n-type pillar layer 11). Thus, the depletion layer extends also in the p-type pillar layer 12a and the n-type pillar layer 11a, and a breakdown voltage in the termination region becomes higher.

For example, the depletion layer is adjusted in such a way that the depletion layer extends also in the p-type pillar layer 12a (or the n-type pillar layer 11a) by adjusting the impurity concentration of the p-type pillar layer 12a (or the n-type pillar layer 11a) in the outermost peripheral portion to be almost a half of the impurity concentration of the p-type pillar layer 12 (or the n-type pillar layer 11).

However, the smaller the area of the mask opening is, the greater a variation in the area of the opening is. For example, "the width" of the opening is defined as the width of the opening when seen from the direction vertical to the major surface of the drain layer 10.

In the case where a variation in the width of the opening is plus or minus 0.1 μm, a variation in the area of the opening is plus or minus about 10% where the length of one side of the opening is 2 μm, whereas a variation in the area of the opening is plus or minus about 20% where the length of one side of the opening is 1 μm.

Thus, in the reference sample, it is likely that a variation in the amount of an impurity contained in the p-type pillar layer 12a and a variation in the amount of an impurity contained in the n-type pillar layer 11a become greater and the breakdown voltage becomes lower in the outermost peripheral portion of the SJ structure.

On the contrary, the SJ structure 80A is formed by a method shown below in the first embodiment.

Figure 4:
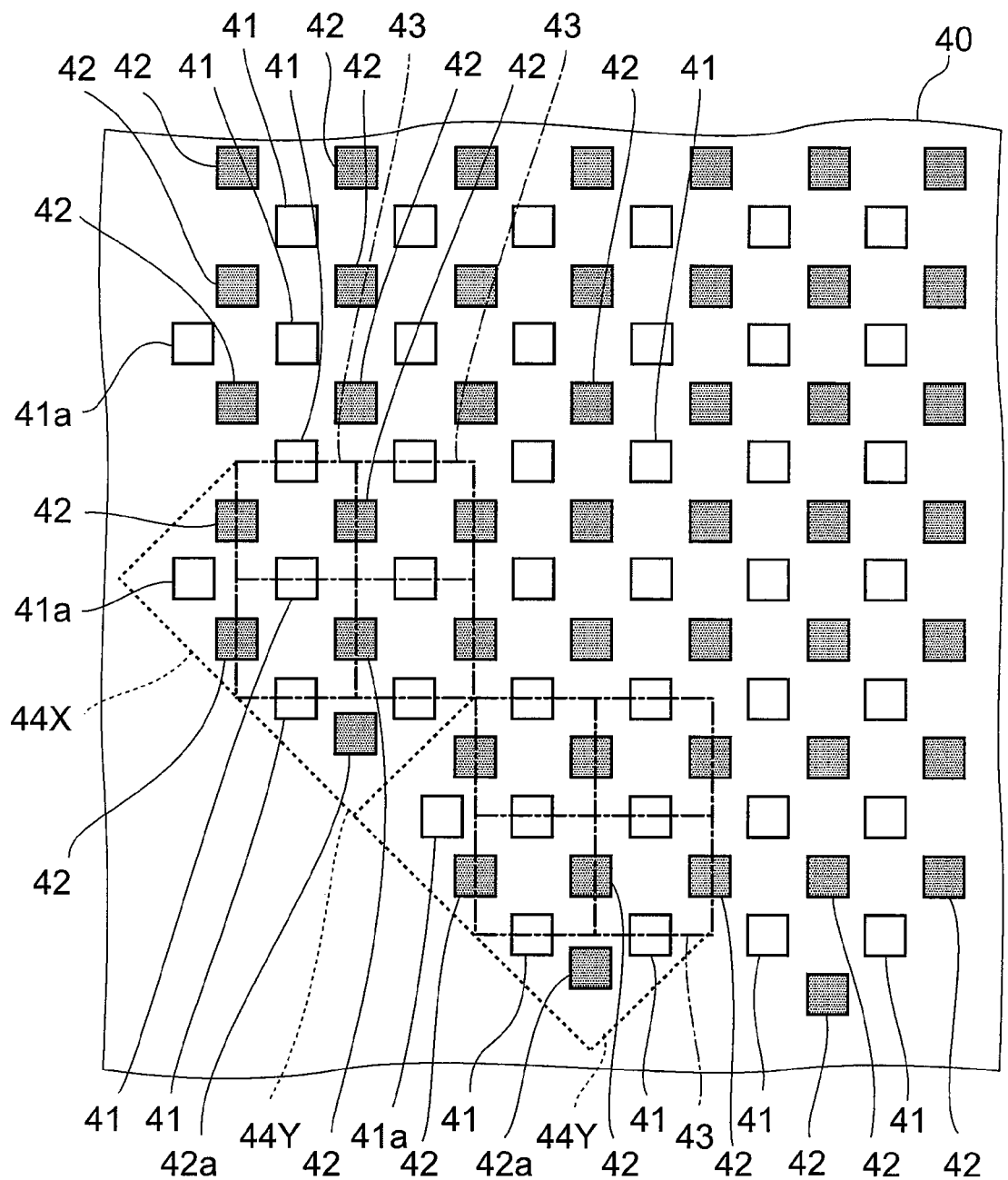
FIG. 4 is a schematic plane view illustrating a mask pattern for forming a super junction structure according to the first embodiment.

FIG. 4 is a schematic plane view illustrating a mask pattern for forming the super junction structure according to the first embodiment.

A mask pattern 40 according to the first embodiment is used in forming the region 90 shown in FIG. 1. FIG. 4 shows the portion near the outermost peripheral portion of the mask pattern 40. In the ion implantation, an impurity is selectively implanted in the semiconductor layer through the openings of the mask pattern 40. In FIG. 4, for convenience, openings 41 and 41a for implanting an n-type impurity and openings 42 and 42a for implanting a p-type impurity are shown together. In the actual mask, only the openings 41 and 41a are provided in the mask for implanting an n-type impurity in the semiconductor layer, whereas only the openings 42 and 42a are provided in the mask for implanting a p-type impurity in the semiconductor layer.

In the mask pattern 40, the openings 41, 41a, 42, and 42a are periodically disposed in dots. The position of the opening 41a corresponds to the position of the n-type pillar layer disposed in the outermost peripheral portion of the SJ structure 80A. The position of the opening 42a corresponds to the position of the p-type pillar layer disposed in the outermost peripheral portion of the SJ structure 80A. The openings 41 and 42 respectively correspond to the n-type pillar layer and the p-type pillar layer disposed in the SJ structure 80A in the portion other than the outermost peripheral portion. The areas of the openings 41, 41a, 42, and 42a are almost the same.

The periodic structure in the outermost peripheral portion of the mask pattern 40 corresponds to the periodic structure in the outermost peripheral portion of the SJ structure 80A. The periodic structure of the mask pattern 40 in the portion other than the outermost peripheral portion corresponds to the periodic structure of the SJ structure 80A in the portion other than the outermost peripheral portion. The periodic structure in the outermost peripheral portion of the mask pattern 40 is different from the periodic structure of the mask pattern 40 in the portion other than the outermost peripheral portion.

For example, in the X-axis direction, the repetition interval of the opening 41a is two times the repetition interval of the opening 42. In the Y-axis direction, the repetition interval of the opening 42a is two times the repetition interval of the opening 41. In the X-axis direction, a part of the opening 41a is inserted between the openings 42 facing each other. In the Y-axis direction, a part of the opening 42a is inserted between the openings 41 facing each other.

An interval between the opening 41a and the opening 41 adjacent thereto on the inner side is provided in such a way that the interval therebetween is narrower than an interval between the openings 41 adjacent to each other in the Y-axis direction. An interval between the opening 42a and the opening 42 adjacent thereto on the inner side is provided in such a way that the interval therebetween is narrower than an interval between the openings 41 adjacent to each other in the X-axis direction.

In FIG. 4, the region of the unit cell 43 and the regions of outermost unit cells 44X and 44Y in the active region 1a are shown. In the mask pattern 40, the area of the opening 41 and the area of the opening 42 are almost the same in the unit cell 43. In the mask pattern 40, the area of the opening 41a and the area of the opening 42 are almost the same in the outermost unit cell 44X in the X-axis direction. In the mask pattern 40, the area of the opening 42a and the area of the opening 41 are almost the same in the outermost unit cell 44Y in the Y-axis direction.

In the first embodiment, combining the unit cell 43 and the outermost unit cells 44X and 44Y prevents the breakdown in the outermost peripheral portion. Thus, the areas of the openings 41a and 42a in the outermost peripheral portion can be formed having almost the same areas as the openings 41 and 42 in the portion other than the outermost peripheral portion. Thus, in the mask pattern 40 according to the first embodiment, variations are suppressed in the areas of the openings.

When the mask pattern 40 as described above is used for the ion implantation, in the unit cell 43 and the outermost unit cells 44X and 44Y, the impurity concentration in the n-type pillar layer and the amount of an impurity contained in the p-type pillar layer are made almost the same.

Figure 5:
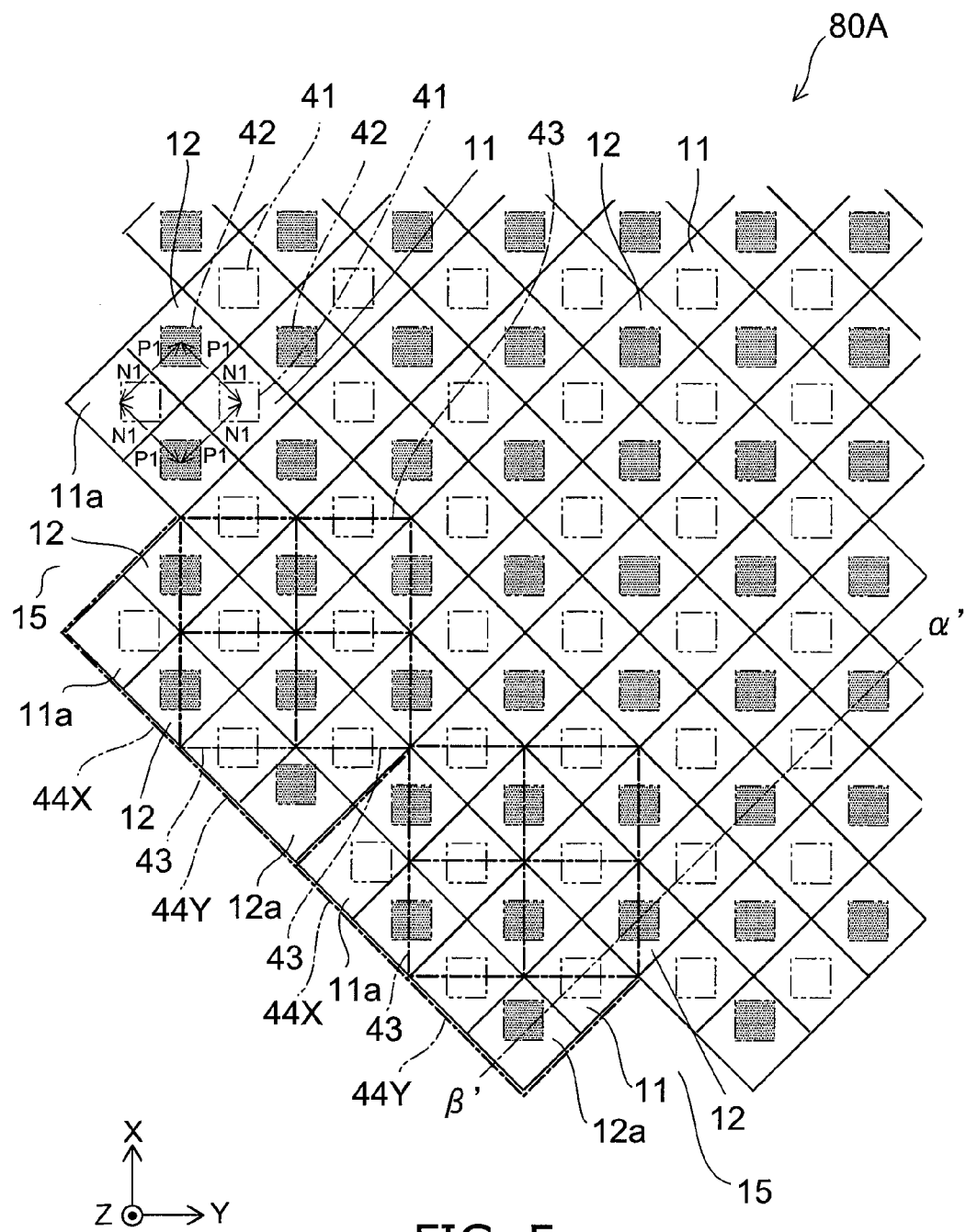
FIG. 5 is a schematic plane view illustrating the super junction structure according to the first embodiment.

FIG. 5 shows schematic planar configurations when the SJ structure 80A is formed using the mask pattern 40.

FIG. 5 is a schematic plane view illustrating the super junction structure according to the first embodiment.

The schematic cross sectional view shown in FIG. 1B corresponds to the position of a line α'-β', for example, shown in FIG. 5.

FIG. 5 shows the openings 41 and 42 and so on of the mask pattern 40 in addition to the n-type pillar layer 11, the p-type pillar layer 12, and so on, in order to understand the correspondence between the positions of the individual pillar layers and the positions of the openings of the mask pattern. In FIG. 5, the unit cell 43 and the outermost unit cells 44X and 44Y in the active region is are shown.

As shown in FIG. 5, the area of the n-type pillar layer 11 and the area of the p-type pillar layer 12 are almost the same in the unit cell 43. The area of the n-type pillar layer 11a and the area of the p-type pillar layer 12 are almost the same also in the outermost unit cell 44X, and the area of the p-type pillar layer 12a and the area of the n-type pillar layer 11 are almost the same also in the outermost unit cell 44Y. Namely, the amount of an impurity contained in the n-type pillar layer and the amount of an impurity contained in the p-type pillar layer are almost the same in each of the unit cells 43 and each of the outermost unit cells 44X and 44Y.

In the SJ structure 80A according to the first embodiment, the n-type pillar layers 11 and 11a and the p-type pillar layers 12 and 12a are disposed in dots when seen from the direction vertical to the major surface of the drain layer 10. The periodic structure in the outermost peripheral portion of the SJ structure 80A is different from the periodic structure in the SJ structure 80A in the portion other than the outermost peripheral portion. For example, the periodic structure in the outermost peripheral portion of the SJ structure 80A in the X-axis direction is different from the periodic structure in the outermost peripheral portion of the SJ structure 80A in the Y-axis direction.

More specifically, in the X-axis direction, the n-type pillar layer 11a is formed at a location at which the opening 41a is provided. The n-type pillar layer 11a is located in the outermost peripheral portion of the SJ structure 80A. The p-type pillar layer 12 is adjacent to the n-type pillar layer 11a on the inner side of the SJ structure 80A. The n-type pillar layer 11a is provided between the p-type pillar layers 12 facing each other. The high resistance layer 15 is adjacent to the n-type pillar layer 11a and the p-type pillar layer 12a on the side opposite to the SJ structure 80A.

In the Y-axis direction, the p-type pillar layer 12a is formed at a location at which the opening 42a is provided. The p-type pillar layer 12a is located in the outermost peripheral portion of the SJ structure 80A. The n-type pillar layer 11 is adjacent to the p-type pillar layer 12a on the inner side of the SJ structure 80A. The p-type pillar layer 12a is provided between the n-type pillar layers 11 facing each other. The high resistance layer 15 is adjacent to the p-type pillar layer 12a and the n-type pillar layer 11 on the side opposite to the SJ structure 80A.

In the first embodiment, the pattern of the outermost unit cell 44X in the X-axis direction is different from the pattern of the outermost unit cell 44Y in the Y-axis direction. For example, the repetition interval of the n-type pillar layer 11a is two times the repetition interval of the p-type pillar 12 in the X direction, and the repetition interval of the p-type pillar layer 12a is two times the repetition interval of the n-type pillar layer 11 in the Y direction. Then, the impurity amount of the n-type pillar 11a is almost the same as the impurity amount of the p-type pillar 12 in the outermost unit cells 44X, and the impurity amount of the p-type pillar 12a is almost the same as the impurity amount of the n-type pillar 11 in the outermost unit cells 44Y.

When the semiconductor device 1 is in off-state, a potential difference is provided between the p-type pillar layers 12 and 12a and the n-type pillar layers 11 and 11a in such a way that the potentials of the n-type pillar layers 11 and 11a, for example, are higher than the potentials of the p-type pillar layers 12 and 12a. The impurity concentration in the n-type pillar layer 11 and the amount of an impurity contained in the p-type pillar layer 12 in the unit cell 43 are almost the same. Thus, the depletion layer extends on both the p-type pillar layer 12 side and the n-type pillar layer 11 side from a pn junction between the p-type pillar layer 12 and the n-type pillar layer 11, and each of the p-type pillar layers 12 and each of the n-type pillar layers 11 are completely depleted at a predetermined voltage.

For example, in the drawing, the direction of the depletion layer extending from the pn junction between the p-type pillar layer 12 and the n-type pillar layer 11 to the p-type pillar layer 12 side is expressed by an arrow P1, and the direction of the depletion layer extending from the pn junction interface to the n-type pillar layer 11 side is expressed by an arrow N1. Thus, the active region 1a of the semiconductor device 1 holds a high breakdown voltage.

As described above, the amount of the impurity contained in the n-type pillar layer and the amount of the impurity contained in the p-type pillar layer in the outermost unit cells 44X and 44Y are almost the same. Thus, the depletion layer extends on both the p-type pillar layer 12 side and the n-type pillar layer 11a side from a pn junction between the n-type pillar layer 11a located in the outermost peripheral portion and the p-type pillar layer 12 adjacent to the n-type pillar layer 11a, and each of the p-type pillar layers 12 and the n-type pillar layer 11a are completely depleted at a predetermined voltage.

For example, in the drawing, the direction of the depletion layer extending from a pn junction between the p-type pillar layer 12 and the n-type pillar layer 11a to the p-type pillar layer 12 side is expressed by the arrow P1, and the direction of the depletion layer extending from the pn junction to the n-type pillar layer 11a side is expressed by the arrow N1. A similar phenomenon possibly occurs also in the p-type pillar layer 12a located in the outermost peripheral portion. Thus, in the semiconductor device 1, the end portion of the active region 1a (the outermost peripheral portion of to the SJ structure 80A) holds a high breakdown voltage.

It is noted that when an impurity is ion-implanted in the semiconductor layer actually using the mask pattern 40, a distance between the n-type pillar layer 11a and the p-type pillar layer 12 becomes shorter than a distance between the n-type pillar layer 11 and the p-type pillar layer 12. This is because a distance between the opening 41a and the opening 42 is shorter than a distance between the opening 41 and the opening 42 in the mask pattern 40. Namely, the impurity profile of the n-type pillar layer 11a overlaps the impurity profile of the p-type pillar layer 12.

In other words, an interval between the n-type pillar layer 11a located in the outermost peripheral portion and the n-type pillar layer 11 adjacent in the Y-axis direction is narrower than the array pitch of the n-type pillar layer 11 in the SJ structure 80A. An interval between the p-type pillar layer 12a located in the outermost peripheral portion and the p-type pillar layer 12 adjacent in the X-axis direction is narrower than the array pitch of the p-type pillar layer 12 in the SJ structure 80A.

Here, suppose that the positions of the n-type pillars 11 and 11a and the p-type pillars 12 and 12a are the peak position of the impurity concentration in each of the pillars. The peak position of the concentration of an impurity contained in each of the pillars corresponds to the position of each of the openings of the mask pattern 40.

Thus, the effective impurity concentration of the n-type pillar layer 11a is reduced as compared with the effective impurity concentration of the n-type pillar layer 11. Similarly, the distance between the n-type pillar layer 11 and the p-type pillar layer 12a becomes shorter than the distance between the n-type pillar layer 11 and the p-type pillar layer 12. Thus, the effective impurity concentration of the p-type pillar layer 12a is reduced as compared with the effective impurity concentration of the p-type pillar layer 12. As a result, the outermost peripheral portion of the SJ structure 80A tends to be completely depleted more than the SJ structure 80A in the portion other than the outermost peripheral portion, and the breakdown voltage is made higher in the outermost peripheral portion of the SJ structure 80A.

Namely, in the SJ structure 80A, the interval between the n-type pillar layer 11a located in the outermost peripheral portion and the n-type pillar layer 11 located on the inner side of the n-type pillar layer 11a is made narrower than the array pitch of the n-type pillar layer 11, and the interval between the p-type pillar layer 12a located in the outermost peripheral portion and the p-type pillar layer 12 located on the inner side of the p-type pillar layer 12a is made narrower than the array pitch of the p-type pillar layer 12. Thus, it is possible to reduce the effective impurity concentrations of the n-type pillar layer 11a and the p-type pillar layer 12a located in the outermost peripheral portion and to improve the breakdown voltage.

Here, the term "effective impurity concentration" means a concentration that the p-type impurity concentration is subtracted from the n-type impurity concentration in the n-type semiconductor layer, or a concentration that the n-type impurity concentration is subtracted from the p-type impurity concentration in the p-type semiconductor layer.

It is noted that in FIG. 4, the embodiment is shown in which a part of the opening 41a is inserted between the openings 42 facing each other in the X-axis direction and a part of the opening 42a is inserted between the openings 41 facing each other in the Y-axis direction. However, such a mask pattern may be possible in which the opening 41a is sandwiched between the openings 42 facing each other and the opening 42a is sandwiched between the openings 41 facing each other. The similar advantage can be obtained also using such a mask pattern.

As described above, in the mask pattern 40, since the areas of the openings 41, 41a, 42, and 42a are almost the same, the variation of the impurity concentration is suppressed in the n-type pillar layer 11a and the p-type pillar layer 12a. Thus, the breakdown voltage of the semiconductor device 1 becomes higher than the breakdown voltage in the reference sample.

Second Embodiment

Figure 6:
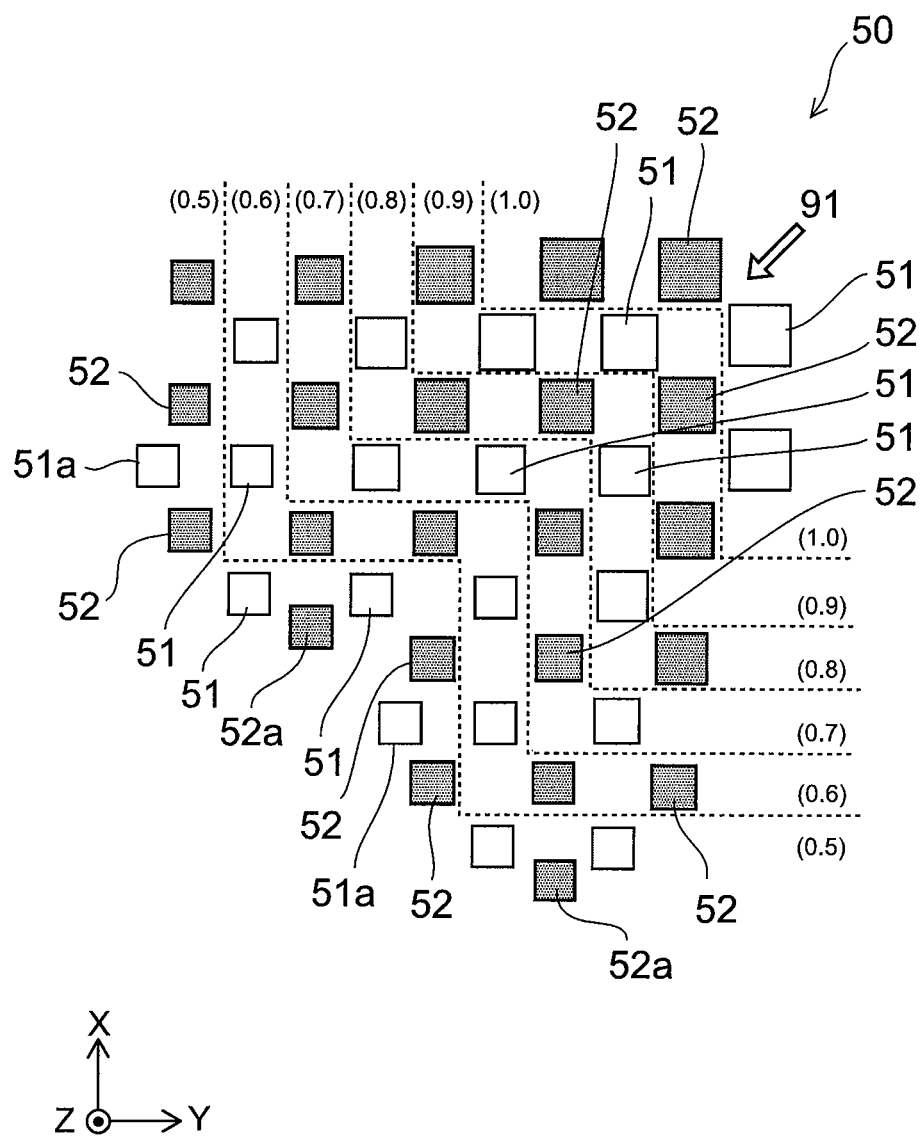
FIG. 6 is a schematic plane view illustrating a mask pattern for forming a super junction structure according to a second embodiment.

FIG. 6 is a schematic plane view illustrating a mask pattern for forming a super junction structure according to a second embodiment.

The mask pattern 50 according to the second embodiment is used in forming the region 90 shown in FIG. 1. In FIG. 6, for convenience, openings 51 and 51a for implanting an n-type impurity and openings 52 and 52a for implanting a p-type impurity are shown together. The actual mask for implanting an n-type impurity includes only the openings 51 and 51a, whereas the mask for implanting a p-type impurity includes only the openings 52 and 52a.

In FIG. 6, openings having the same area are shown in the same group divided by broken lines. Numerical characters shown in brackets are the specification value of the area of the openings belonging to the groups.

In the mask pattern 50, the area of the opening 51 and the area of the opening 52 are reduced step by step from the inner side to the outermost peripheral portion in the SJ structure (in a direction of an arrow 91 in the drawing). For example, the area of the opening 51 and the area of the opening 52 are changed step by step in the X-axis direction and the Y-axis direction.

More specifically, the area of the opening 51 is reduced step by step in such a way that the area is 1.0, 0.9, 0.8, 0.7, 0.6, and 0.5 in order from the inner side group to the outer side group. The area of the opening 52 is reduced step by step in such a way that the area is 1.0, 0.9, 0.8, 0.7, 0.6, and 0.5 in order from the inner side group to the outer side group. The areas of the openings 51a and 52a in the outermost peripheral portion are 0.5.

Figure 7:
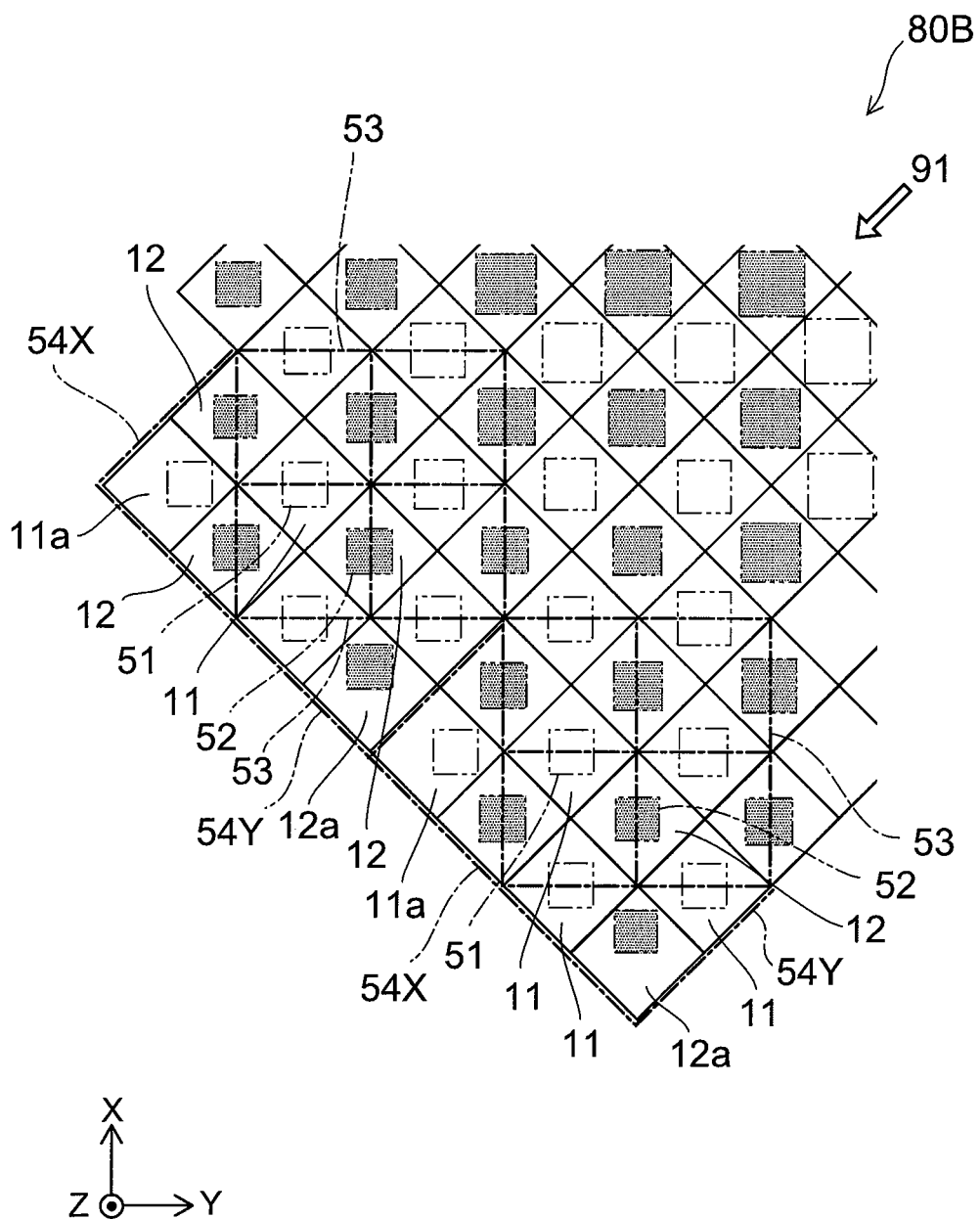
FIG. 7 is a schematic plane view illustrating the super junction structure according to the second embodiment.

When the SJ structure is formed using the mask pattern 50 as described above, the SJ structure is formed as shown in FIG. 7.

FIG. 7 is a schematic plane view illustrating the super junction structure according to the second embodiment.

FIG. 7 shows the openings 51 and 52 and so on of the mask pattern 50 in addition to an n-type pillar layer 11, a p-type pillar layer 12, and so on, in order to understand the correspondence between the positions of the individual pillar layers and the openings of the mask pattern. Additionally, FIG. 7 shows the boundary of a unit cell 53 in an active region 1a and the boundaries of outermost unit cells 54X and 54Y in the outermost peripheral portion.

In an SJ structure 80B according to the second embodiment, each of the n-type pillar layers 11 and each of the p-type pillar layers 12 are periodically disposed in dots. As described above, the area of the opening of the mask pattern 50 is reduced step by step from the inner side to the outermost peripheral portion in the SJ structure 80B. Thus, the impurity concentration in the n-type pillar layer 11 and the impurity concentration in the p-type pillar layer 12 are changed step by step in the X-axis direction and the Y-axis direction. For example, the impurity concentration in the n-type pillar layer 11 and the impurity concentration in the p-type pillar layer 12 are reduced step by step from the inner side to the outermost peripheral portion in the SJ structure 80B (in the direction of the arrow 91 in the drawing).

In the SJ structure 80B according to the second embodiment, the area of the n-type pillar layer 11 and the area of the p-type pillar layer 12 are almost the same in the unit cell 53. The area of an n-type pillar layer 11a and the area of the p-type pillar layer 12 are almost the same also in the outermost unit cell 54X, and the area of a p-type pillar layer 12a and the area of the n-type pillar layer 11 are almost the same also in the outermost unit cell 54Y. Namely, the amount of an impurity contained in the n-type pillar layer and the amount of an impurity contained in the p-type pillar layer are almost the same in each of the unit cells 53 and each of the outermost unit cells 54X and 54Y.

As described above, in the mask pattern 50, the areas of the opening 51 and the opening 52 are almost the same in the unit cell 53. Thus, in the SJ structure 80B, the amount of an impurity contained in the n-type pillar layer 11 and the amount of an impurity contained in the p-type pillar layer 12 are almost the same in the unit cell 53. In the mask pattern 50, the areas of the opening 51a and the opening 52 are almost the same in the outermost unit cell 54X, and the areas of the opening 51 and the opening 52a are almost the same in the outermost unit cell 54Y. Thus, in the SJ structure 80B, the amount of an impurity contained in the n-type pillar layer 11a and the amount of an impurity contained in the p-type pillar layer 12 are made almost the same in the outermost unit cell 54X, and the amount of an impurity contained in the n-type pillar layer 11 and the amount of an impurity contained in the p-type pillar layer 12a are made almost the same in the outermost unit cell 54Y.

Namely, in the SJ structure 80B according to the second embodiment, the amount of an impurity contained in the n-type pillar layer and the amount of an impurity contained in the p-type pillar layer are almost the same in each of the unit cells 53 and each of the outermost unit cells 54X and 54Y. Thus, it is possible to completely deplete the n-type pillar layer and the p-type pillar layer in each of the unit cells 53 and each of the outermost unit cells 54X and 54Y. As a result, the SJ structure 80B according to the second embodiment holds a high breakdown voltage.

In the SJ structure 80B according to the second embodiment, the amounts of impurities contained in the unit cell 53 are reduced step by step from the inner side to the outermost peripheral portion (in the direction of the arrow 91 in the drawing), with maintaining the balance between the amount of an impurity contained in the n-type pillar layer and the amount of an impurity contained in the p-type pillar layer in the unit cell 53 and the outermost unit cells 54X and 54Y. Thus, the breakdown voltage at the end portion of the SJ structure 80B becomes higher.

Generally, the electric field distribution in the outermost peripheral portion of the SJ structure 80B is modulated more easily by the electric field concentration at the end of a base layer 13 as the outermost peripheral portion of the SJ structure 80B is formed closer to the end of base layer 13. When the electric field distribution in the outermost peripheral portion of the SJ structure 80B is modulated, the breakdown voltage at the end of the SJ structure 80B becomes lower in same cases.

In the second embodiment, since the breakdown voltage at the end of the SJ structure 80B is increased in advance, the breakdown voltage at the end of the SJ structure 80B does not tend to be reduced even though the outermost peripheral portion of the SJ structure 80B is formed closer to the end of the base layer 13. Thus, a width of an extra offset region can be shortened, which is provided between the outermost peripheral portion of the SJ structure 80B and the end of the base layer 13, thereby the device area is made much smaller.

Since the areas of the openings belonging to a group shown in FIG. 7 are almost the same, a variation in the width of the opening for the individual groups are made almost the same. As a result, the impurity concentration in the pillar layer does not tend to be varied on the pillar to pillar basis at the end of the SJ structure 80B, and a reduction in the breakdown voltage at the end of the SJ structure 80B is suppressed.

Third Embodiment

Figure 8:
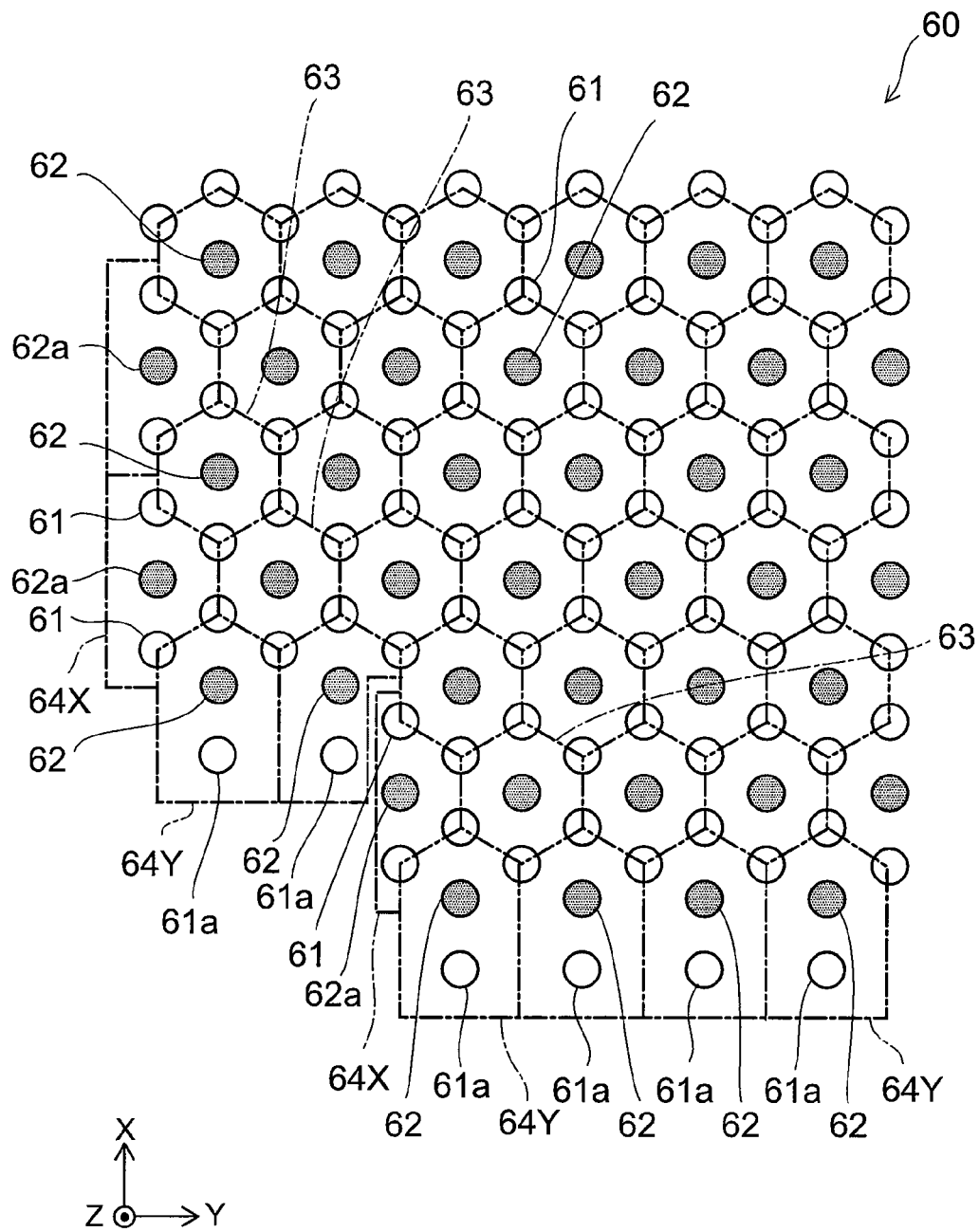
FIG. 8 is a schematic plane view illustrating a mask pattern for forming a super junction structure according to a third embodiment.

FIG. 8 is a schematic plane view illustrating a mask pattern for forming a super junction structure according to a third embodiment. FIG. 8 shows the boundary of a unit cell 63 and the boundaries of outermost unit cells 64X and 64Y in an active region 1a.

A mask pattern 60 according to the third embodiment is used in forming the SJ structure in the region 90 shown in FIG. 1. FIG. 8 shows a portion near the outermost peripheral portion of the mask pattern 60. In ion implantation, an impurity is selectively implanted in a semiconductor layer through the openings of the mask pattern 60. In FIG. 8, for convenience, openings 61 and 61a for implanting an n-type impurity and openings 62 and 62a for implanting a p-type impurity are shown together. The actual mask for implanting an n-type impurity in the semiconductor layer includes only the openings 61 and 61a, whereas the mask for implanting a p-type impurity in the semiconductor layer includes only the openings 62 and 62a.

In the mask pattern 60, the opening 61 is disposed in a honeycomb, and the opening 62 is surrounded by the openings 61. The periodic structure in the outermost peripheral portion of the mask pattern 60 corresponds to the periodic structure in the outermost peripheral portion of the SJ structure. The periodic structure of the mask pattern 60 in the portion other than the outermost peripheral portion corresponds to the periodic structure of the SJ structure in the portion other than the outermost peripheral portion. The periodic structure in the outermost peripheral portion of the mask pattern 60 is different from the periodic structure of the mask pattern 60 in the portion other than the outermost peripheral portion.

For example, in the outermost peripheral portion of the mask pattern 60, the opening 62a is sandwiched between the openings 61 in the outermost unit cell 64X in the X-axis direction. In the X-axis direction, two openings 61 and a single opening 62a are arranged on a line. In the outermost peripheral portion of the mask pattern 60, the outermost unit cell 64Y includes the opening 61. The opening 61a is disposed on the end position, and the openings 61a are arranged on a line in the Y-axis direction.

In the mask pattern 60, the repetition interval of the opening 62a and the repetition interval of the opening 62 are almost the same in the X-axis direction. In the mask pattern 60, the repetition interval of the opening 61a and the repetition interval of the opening 62 are almost the same in the Y-axis direction.

In the mask pattern 60, the area of the opening 61 is almost two times the area of the opening 62 in the unit cell 63. In the mask pattern 60, the area of the opening 61 is almost two times the area of the opening 62 in the outermost unit cell 64X in the X-axis direction. In the mask pattern 60, the area of the opening 61 is two times the area of the opening 62 in the outermost unit cell 64Y in the Y-axis direction.

In the third embodiment, the mask pattern 60 is formed by combining the unit cell 63 and the outermost unit cells 64X and 64Y. The areas of the openings 61 and 62 in the outermost peripheral portion and the areas of the openings 61 and 62 in the portion other than the outermost peripheral portion are made almost the same. Thus, the variations in the areas of the openings are suppressed in the mask pattern 60 according to the third embodiment.

When ion implantation is performed using the mask pattern 60, a dosed amount (atoms/cm$^2$) implanted from the opening 62 to the semiconductor layer is made almost two times a dosed amount (atoms/cm$^2$) implanted from the opening 61 to the semiconductor layer. Thus, in the unit cell 63 and the outermost unit cells 64X and 64Y, the impurity concentration in an n-type pillar layer 11 and the amount of an impurity contained in a p-type pillar layer 12 are made almost the same.

Figure 9:
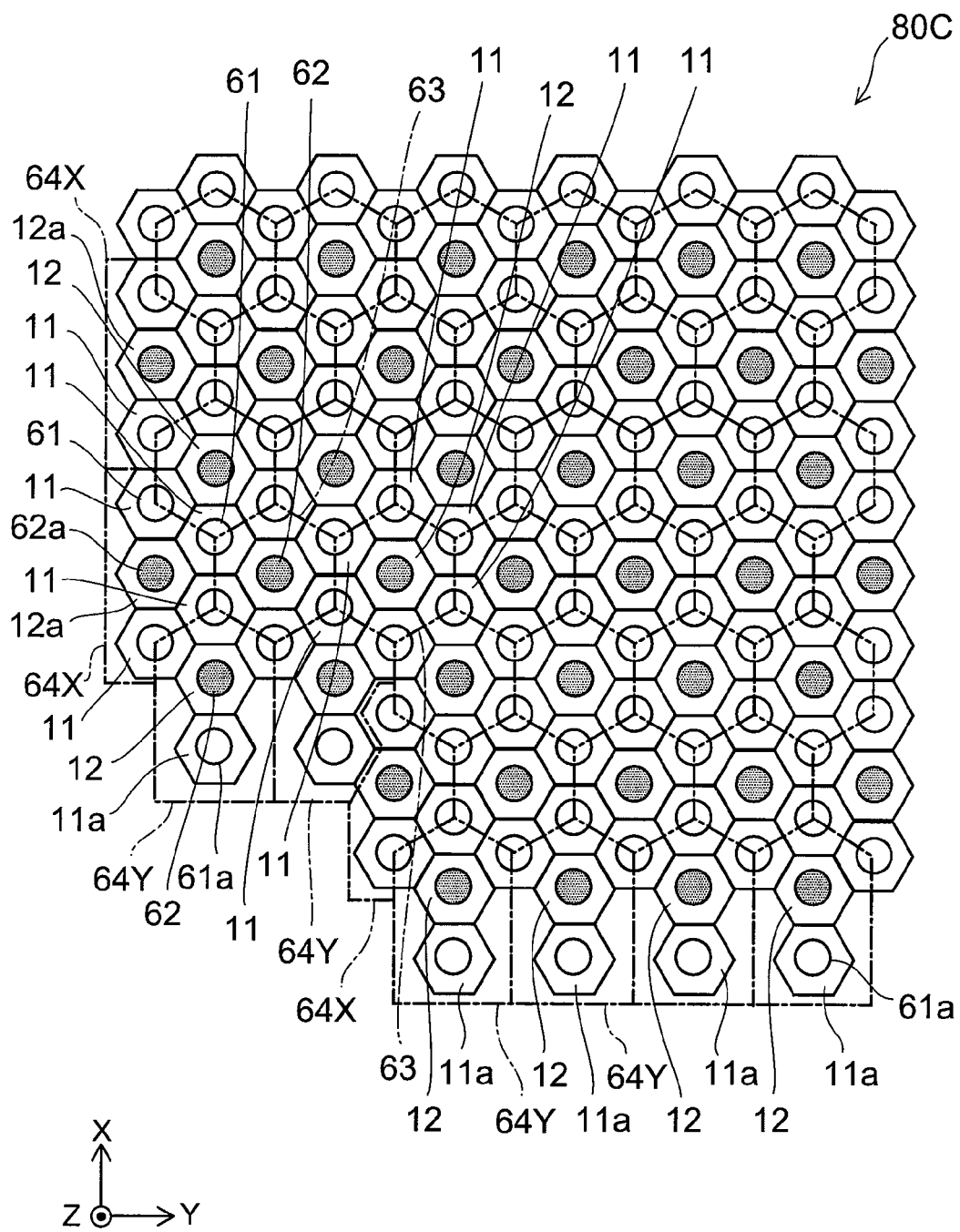
FIG. 9 is a schematic plane view illustrating the super junction structure according to the third embodiment.

When the SJ structure is formed using the mask pattern 60 as described above, the SJ structure is formed as shown in FIG. 9.

FIG. 9 is a schematic plane view illustrating the super junction structure according to the third embodiment.

FIG. 9 shows the openings 61 and 62 and so on of the mask pattern 60 in addition to the n-type pillar layer 11, the p-type pillar layer 12, and so on, in order to understand the correspondence between the positions of the individual pillar layers and the openings of the mask pattern. Additionally, FIG. 9 shows the boundary of the unit cell 63 and the boundaries of the outermost unit cells 64X and 64Y in the outermost peripheral portion in the active region 1a.

In an SJ structure 80C according to the third embodiment, the n-type pillar layer 11 is disposed in a honeycomb when seen from the direction vertical to the major surface of a drain layer 10. The p-type pillar layer 12 is surrounded by the n-type pillar layer 11. The periodic structure in the outermost peripheral portion of the SJ structure 80C is different from the periodic structure of the SJ structure 80C in the portion other than the outermost peripheral portion.

In the SJ structure 80C, the repetition interval of the p-type pillar layer 12a in the X-axis direction in the outermost peripheral portion is the same as the repetition interval of the p-type pillar layer 12 in the X-axis direction in the portion other than the outermost peripheral portion. The repetition interval of the n-type pillar layer 11a in the Y-axis direction in the outermost peripheral portion is the same as the cycle of the p-type pillar layer 12 in the Y-axis direction in the portion other than the outermost peripheral portion.

Even though the n-type pillar layer 11 is disposed in a honeycomb, the outermost unit cell 64X in the X-axis direction and the outermost unit cell 64Y in the Y-axis direction are disposed in the outermost peripheral portion, so that the amounts of impurities contained in the outermost unit cells 64X and 64Y are almost the same, and the areas of the openings of the mask pattern are almost the same in the active region 1a and a termination region 1b.

Also in the third embodiment, such a configuration may be possible in which the impurity concentration in the pillar layer is changed step by step to increase the breakdown voltage at the end of the SJ structure 80C like the second embodiment.

Hereinabove, exemplary embodiments are explained with reference to specific examples. However, the embodiments are not limited to these specific examples. Namely, those whose design is appropriately modified and altered in these specific examples by a person skilled in the art are also included in the scope of the embodiments to the extent that the purport of the invention is included. Components included in the specific examples and the disposition, material, conditions, shape, size, and the like of the components are not limited to those illustrated above, which can be modified and altered appropriately.

For example, in the embodiments, the explanation is given in which the first conductive type is an n-type and the second conductive type is a p-type. However, such a structure is also included in the embodiments in which the first conductive type is a p-type and the second conductive type is an n-type.

Moreover, the explanation is given using the planar gate structure. However, the similar advantages can be obtained using a trench gate structure in which pillars are similarly disposed.

Furthermore, the structure is shown in which the guard ring layer is formed on the surface of the termination region. However, the embodiments can be implemented also using other structures such as a RESURF (Reduced Surface Field) structure or a field plate structure, with no limitation to the terminal end structure.

Moreover, the explanation is given using the processes of repeating ion implantation and burying crystal growth. However, the embodiments can be implemented also using other processes such as the processes of changing an accelerating voltage, with no limitation to the process of forming the SJ structure.

Furthermore, the components included in the foregoing embodiments can be combined as long as the combinations are technically feasible, and those combined are also included in the scope of the embodiments as long as the combinations include the features of the embodiments. Additionally, a person skilled in the art will be able to conceive various modifications and alterations within the spirit of the invention. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
a first semiconductor layer of a first conductive type;
a periodic array structure having a second semiconductor layer of a first conductive type and a third semiconductor layer of a second conductive type periodically arrayed on the first semiconductor layer in a direction parallel with a major surface of the first semiconductor layer;
a fourth semiconductor layer of a second conductive type provided on the third semiconductor layer;
a fifth semiconductor layer of a first conductive type selectively provided on a surface of the fourth semiconductor layer;
a control electrode facing a part of the second semiconductor layer, the fourth semiconductor layer, and a part of the fifth semiconductor layer via an insulating film;
a sixth semiconductor layer of a first conductive type provided on the first semiconductor layer on an outer side of the periodic array structure, a concentration of an impurity contained in the sixth semiconductor layer being lower than a concentration of an impurity contained in the periodic array structure;
a first major electrode electrically connected to the first semiconductor layer; and
a second major electrode connected to the fourth semiconductor layer and the fifth semiconductor layer,
the second semiconductor layer and the third semiconductor layer being disposed in dots on the first semiconductor layer,
a periodic structure in the outermost peripheral portion of the periodic array structure being different from a periodic structure of the periodic array structure in a portion other than the outermost peripheral portion.

2. The device according to claim 1, wherein:
the first semiconductor layer is a rectangle; and
the periodic structure in the outermost peripheral portion of the periodic array structure in a direction parallel with a side of the rectangle is different from the periodic structure in the outermost peripheral portion of the periodic array structure in a direction orthogonal to the side.

3. The device according to claim 1,
wherein a repetition interval of one of the second semiconductor layer and the third semiconductor layer in the outermost peripheral portion is two times a repetition interval of the other of the second semiconductor layer and the third semiconductor layer along the outermost peripheral portion.

4. The device according to claim 1, wherein:
an interval between the second semiconductor layer and the third semiconductor layer adjacent to each other in the outermost peripheral portion is narrower than an interval between the second semiconductor layer and the third semiconductor layer adjacent to each other in the periodic array structure.

5. The device according to claim 1, wherein an interval between the second semiconductor layer in the outermost peripheral portion and the second semiconductor layer on an inner side of the outermost peripheral portion is narrower than an array pitch of the second semiconductor layer in the periodic array structure; and
an interval between the third semiconductor layer in the outermost peripheral portion and the third semiconductor layer on an inner side of the outermost peripheral portion is narrower than an array pitch of the third semiconductor layer in the periodic array structure.

6. The device according to claim 1, wherein an amount of a first conductive type impurity contained in the second semiconductor layer is equal to an amount of a second conductive type impurity contained in the third semiconductor layer in the periodic array structure;
an amount of a first conductive type impurity contained in the second semiconductor layer in the outermost peripheral portion is equal to the amount of the first conductive type impurity contained in the second semiconductor layer in the periodic array structure; and
an amount of a second conductive type impurity contained in the third semiconductor layer in the outermost peripheral portion is equal to the amount of the first conductive type impurity contained in the third semiconductor layer in the periodic array structure.

7. The device according to claim 1, wherein at least a part of the second semiconductor layer is sandwiched between the third semiconductor layers in the outermost peripheral portion; and
at least a part of the third semiconductor layer is sandwiched between the second semiconductor layers in the outermost peripheral portion.

8. The device according to claim 1, wherein the fourth semiconductor layer without the fifth semiconductor layer is provided on the third semiconductor layer in the outermost peripheral portion.

9. The device according to claim 1, wherein a impurity concentration in the sixth semiconductor layer is equal to or less than one-tenth of a impurity concentration in each of the second semiconductor layer and the third semiconductor layer.

10. The device according to claim 1 further comprising:
a guard ring provided on a surface of the sixth semiconductor layer.

11. The device according to claim 1 further comprising:
a field stop layer contacting with the sixth semiconductor layer, wherein the sixth semiconductor layer is located between the periodic array structure and the field stop layer.

12. The device according to claim 1, wherein an amount of an impurity contained in the second semiconductor layer and an amount of an impurity contained in the third semiconductor layer are changed in a direction from an inner side to an outer side in the periodic array structure; and
the amount of an impurity contained in the second semiconductor layer and the amount of an impurity contained in the third semiconductor layer are reduced step by step from the inner side to the outermost peripheral portion.

13. The device according to claim 12, wherein an amount of a first conductive type impurity contained in the second semiconductor layer is equal to an amount of a second conductive type impurity contained in the third semiconductor layer both in the outermost peripheral portion and in the inner side array along the outermost peripheral portion in the periodic array structure.

14. A semiconductor device comprising:
a first semiconductor layer of a first conductive type;
a periodic array structure having a second semiconductor layer of a first conductive type and a third semiconductor layer of a second conductive type periodically arrayed on the first semiconductor layer in a direction parallel with a major surface of the first semiconductor layer;

a fourth semiconductor layer of a second conductive type provided on the third semiconductor layer;

a fifth semiconductor layer of a first conductive type selectively provided on a surface of the fourth semiconductor layer;

a control electrode facing a part of the second semiconductor layer, the fourth semiconductor layer, and a part of the fifth semiconductor layer via an insulating film;

a sixth semiconductor layer of a first conductive type provided on the first semiconductor layer on an outer side of the periodic array structure, a impurity concentration in the sixth semiconductor layer being lower than a impurity concentration in the periodic array structure;

a first major electrode electrically connected to the first semiconductor layer; and a second major electrode connected to the fourth semiconductor layer and the fifth semiconductor layer, the second semiconductor layer being disposed in a honeycomb on the first semiconductor layer, the third semiconductor layer being surrounded by the second semiconductor layer, a periodic structure in the outermost peripheral portion of the periodic array structure being different from a periodic structure of the periodic array structure in a portion other than the outermost peripheral portion.

15. The device according to claim 14, wherein the first semiconductor layer is a rectangle;

a repetition interval of the third semiconductor layer in the outermost peripheral portion is equal to a repetition interval of the third semiconductor layer in the periodic array structure in a portion other than the outermost peripheral portion in a direction parallel with a side of the rectangle; and a repetition interval of the second semiconductor layer in the outermost peripheral portion is equal to the repetition interval of the third semiconductor layer in the periodic array structure in a portion other than the outermost peripheral portion in a direction orthogonal to the side of the rectangle.

16. The device according to claim 14, wherein an amount of a second conductive type impurity contained in the third semiconductor layer is two times an amount of a first conductive type impurity contained in the second semiconductor layer.

17. The device according to claim 14, wherein an repetition interval of the second semiconductor layer in the outermost peripheral portion in a direction vertical to a side of the honeycomb is equal to an repetition interval of the third semiconductor layer in the vertical direction.

* * * * *